United States Patent [19]

Vig et al.

[11] Patent Number: 5,530,408
[45] Date of Patent: Jun. 25, 1996

[54] METHOD OF MAKING AN OVEN CONTROLLED CRYSTAL OSCILLATOR THE FREQUENCY OF WHICH REMAINS ULTRASTABLE UNDER TEMPERATURE VARIATIONS

[75] Inventors: John R. Vig, Colts Neck; Raymond L. Filler, Lebanon, both of N.J.

[73] Assignee: The United States of America as represented by the Secretary of the Army, Washington, D.C.

[21] Appl. No.: 451,106

[22] Filed: May 25, 1995

[51] Int. Cl.$^6$ .............................. H03B 5/04; H03B 5/32; H03L 1/02; H03L 1/04
[52] U.S. Cl. .............................. 331/69; 331/158; 331/70; 310/344; 310/361
[58] Field of Search .................................. 331/66, 68, 69, 331/70, 116 R, 116 FE, 158, 175, 176; 310/315, 341, 342, 343, 344, 361, 360

[56] References Cited

U.S. PATENT DOCUMENTS

| | | | |
|---|---|---|---|
| 3,601,639 | 8/1971 | Hannon et al. | 310/9.5 |
| 4,375,604 | 3/1983 | Vig | 310/312 |
| 4,412,172 | 10/1983 | Vig | 324/56 |
| 4,741,076 | 5/1988 | Vig | 29/25.35 |
| 4,761,298 | 8/1988 | Vig | 427/10 |
| 4,899,117 | 2/1990 | Vig | 331/3 |
| 5,041,800 | 8/1991 | Long et al. | 331/69 |

OTHER PUBLICATIONS

J. A. Kusters, "The SC–Cut Crystal–An Overview", Proceedings of IEEE Ultrasonics Symposium, pp. 402–409, 1981.

E. P. EerNisse and J. A. Kusters, "Orientation Dependence of 'True'SC–Cuts", Proceedings 44th Annual Symposium on Frequency Control, pp. 185–192, 1990.

J. R. Vig and F. L. Walls, "Fundamental Limits on the Frequency Instabilities of Quartz Crystal Oscillators", Proceedings IEEE Frequency Control Symposium, 1994, published Oct. 1994; pp. 506–523.

C. A. Adams, D. C. Bradley & J. A. Kusters, "X–Ray Technology–A Review", Proceedings 41st Annual Symposium on Frequency Control, 1987, pp. 249–257.

J. R. Vig et al, "Adjusting the Frequency vs. Temperature Characteristics of SC–Cut Resonators by Contouring", Proceedings of the 35th Annual Symposium on Frequency Control, 1981, pp. 104–109.

R. L. Filler et al, "Resonators for the Microcomputer–compensated Crystal Oscillator", Proceedings of the 43rd Annual Symposium on Frequency control, 1989, pp. 8–15.

(List continued on next page.)

*Primary Examiner*—David Mis
*Attorney, Agent, or Firm*—Michael Zelenka; George B. Tereschuk

[57] ABSTRACT

The present invention provides for methods of increasing the frequency vs. temperature ("f vs. T") stability of Oven Controlled Crystal Oscillators to levels which are superior to atomic frequency standards and 100 to 10,000 times higher than that currently available from the best crystal oscillators. This method encompasses the steps of making an SC-cut quartz resonator with upper and lower turnover temperatures at or near the resonator's inflection temperature, inserting the resonator into a high-stability oscillator circuit, placing the circuit into a high-stability, high thermal gain oven and adjusting the oven temperature to a set-point at or near one of the resonator's turnover temperatures. A preferred embodiment of the method of the present invention is also disclosed which comprises forming an SC-cut quartz resonator with upper and lower turnover temperatures within 10 K of the resonator's inflection temperature, inserting the resonator into a dual-mode high-stability oscillator circuit which is placed in an oven having a thermal gain exceeding 5,000 and temperature fluctuations smaller than 50 mK and utilizing a thermometric beat frequency of said resonator to adjust the oven temperature to a set-point within 100 mK of the lower turnover temperature.

16 Claims, 2 Drawing Sheets

OTHER PUBLICATIONS

F. L. Walls, "Analysis of High Performance compensated Thermal Enclosures", Proceedings 41st Annual Symposium on Frequency Control, 1987, pp. 439–443.

J. A. Kusters et al, "A No–Drift and Less than $1 \times 10^{-13}$ Long Term Stability Quartz Oscillator Using a GPS S/A Filter", Proceedings 1994 IEEE International Frequency Control Symposium, 1994, published Oct. 1994. pp. 572–577.

4

METHOD OF MAKING AN OVEN CONTROLLED CRYSTAL OSCILLATOR THE FREQUENCY OF WHICH REMAINS ULTRASTABLE UNDER TEMPERATURE VARIATIONS

GOVERNMENT INTEREST

The invention described herein may be manufactured, used and licensed by or for the Government of the United States of America without the payment to us of any royalties thereon.

FIELD OF THE INVENTION

The present invention relates generally to the field of frequency control and timing technology and more particularly to methods of attaining higher frequency stability with respect to temperature variations of piezoelectric devices, particularly Oven Controlled Crystal Oscillators.

BACKGROUND OF THE INVENTION

Description of the Prior Art

Piezoelectric crystal devices are used primarily for precise frequency control and timing, with quartz being the piezoelectric crystal used in most applications. A quartz crystal acts as a stable mechanical resonator, which by its piezoelectric characteristics and high Q value can determine the frequency generated in an oscillator circuit. Of the four basic types of crystal oscillators known, the Oven Controlled Crystal Oscillator ("OCXO") is of particular interest in the present invention.

Until now, the atomic frequency standard exhibited superior stability to the crystal oscillator in the areas of frequency vs. temperature characteristics and aging. Atomic frequency standards have been well known for many years. They provide the highest standard of accuracy heretofore available. While atomic frequency standards embodied in the atomic clock have been commercially available for some time and have undergone many improvements, they still suffer from a number of disadvantages, including being cumbersome due to their large size, and having high power requirements, limited temperature range and, particularly in the case of beam type standards, a limited life.

The method of the present invention provides frequency vs. temperature ("f vs. T") stabilities for an OCXO which are from 100 to 10,000 times greater than presently available. The f vs. T stability of an OCXO depends on a number of factors, including (1) the static and dynamic f vs. T characteristics of the resonator in the sustaining circuit; (2) the difference between the oven's set-point and the point where the static f vs. T characteristic has a zero slope; (3) the oven's temperature excursions from the set-point or oven "cycling" range, and (4) the rate of change of temperature during the oven's temperature excursions.

Those concerned with the development of crystal oscillators, as well as atomic frequency standards, have long recognized the need for higher f vs. T stability. The present invention provides for a method of increasing the f vs. T stabilities of an OCXO which meets this long-felt need and suffers from none of the disadvantages of previously available crystal oscillators with a lesser f vs. T stability such as temperature-compensated crystal oscillators, prior art OCXO's and rubidium frequency standards.

In general, the method of the present invention encompasses the steps of making an SC-cut quartz resonator with turnover temperatures at or near the inflection temperature, inserting the resonator into a high-stability oscillator circuit, placing the resonator in a high-stability, high thermal gain oven and adjusting the oven temperature to a set-point at or near one of the turnover temperatures to provide for higher f vs. T stability in an OCXO.

The temperature stable OCXO produced in accordance with method of the present invention would be extremely useful in applications where recalibration capability, such as that attained with the aid of a Global Positioning System ("GPS") is frequently, but not continuously available. An example is a mobile communications operation where the user returns to a base station which has a recalibration facility where the OCXO can be automatically recalibrated while batteries are being recharged. Such a temperature-stable OCXO along with a recalibration system would be more advantageous in certain situations than having an OCXO continuously locked onto GPS.

The prior art in this field may be found in the following references:

J. A. Kusters, "The SC-Cut Crystal-An Overview," Proceedings of IEEE Ultrasonics Symposium, 1981, pp. 402–409;

E. P. EerNisse and J. A. Kusters, "Orientation Dependence of 'True' SC-Cuts," Proceedings 44th Annual Symposium on Frequency Control, 1990, pp. 185–192;

J. R. Vig and F. L. Walls, "Fundamental Limits on the Frequency Instabilities of Quartz Crystal Oscillators," Proceedings IEEE Frequency Control Symposium, 1994, published Oct. 1994;

C. A. Adams, D. C. Bradley & J. A. Kusters, "X-Ray Technology-A Review," Proceedings 41st Annual Symposium on Frequency Control, 1987, pp. 249–257;

J. R. Vig, W. Washington & R. L. Filler, "Adjusting the Frequency vs. Temperature Characteristics of SC-Cut Resonators by Contouring," Proceedings of the 35th Annual Symposium on Frequency Control, 1981, pp. 104–109;

R. L. Filler and J. R Vig, "Resonators for the Microcomputer-Compensated Crystal Oscillator," Proceedings of the 43rd Annual Symposium on Frequency Control, 1989, pp. 8–15;

F. L. Walls, "Analysis of High Performance Compensated Thermal Enclosures," Proceedings 41st Annual Symposium on Frequency Control, 1987, pp. 439–443;

J. A. Kusters, et. al., "A No-Drift and Less than $1 \times 10^{-13}$ Long Term Stability Quartz Oscillator Using a GPS S/A Filter," Proceedings 1994 IEEE International Frequency Control Symposium, 1994, published Oct. 1994; and J. R. Vig, U.S. Pat. Ser. No. 4,375,604 entitled "Method of Angle Correcting Doubly Rotated Crystal Resonators," Mar. 1, 1983.

SUMMARY OF THE INVENTION

It is an object of this invention to provide an OCXO exhibiting an f vs. T stability superior to that of atomic frequency standards.

It is another object of this invention to provide an OCXO exhibiting f vs. T stabilities 100 to 10,000 times higher than that currently available from the best crystal oscillators.

To attain these and other objects, the present invention contemplates a method of increasing the f vs. T stability of an OCXO comprising the steps of making an SC-cut quartz resonator with turnover temperatures at or near the resonator's inflection temperature, inserting said resonator into a high-stability oscillator circuit, placing said circuit into a high-stability, high thermal gain oven and adjusting the oven temperature to a setpoint at or near one of the turnover temperatures of said resonator. A preferred embodiment of the method of the present invention is also disclosed.

BRIEF DESCRIPTION OF THE DRAWINGS

Other features and details of the present invention will become apparent in light of the Detailed Description of the Invention and the accompanying figure.

Figure 1:
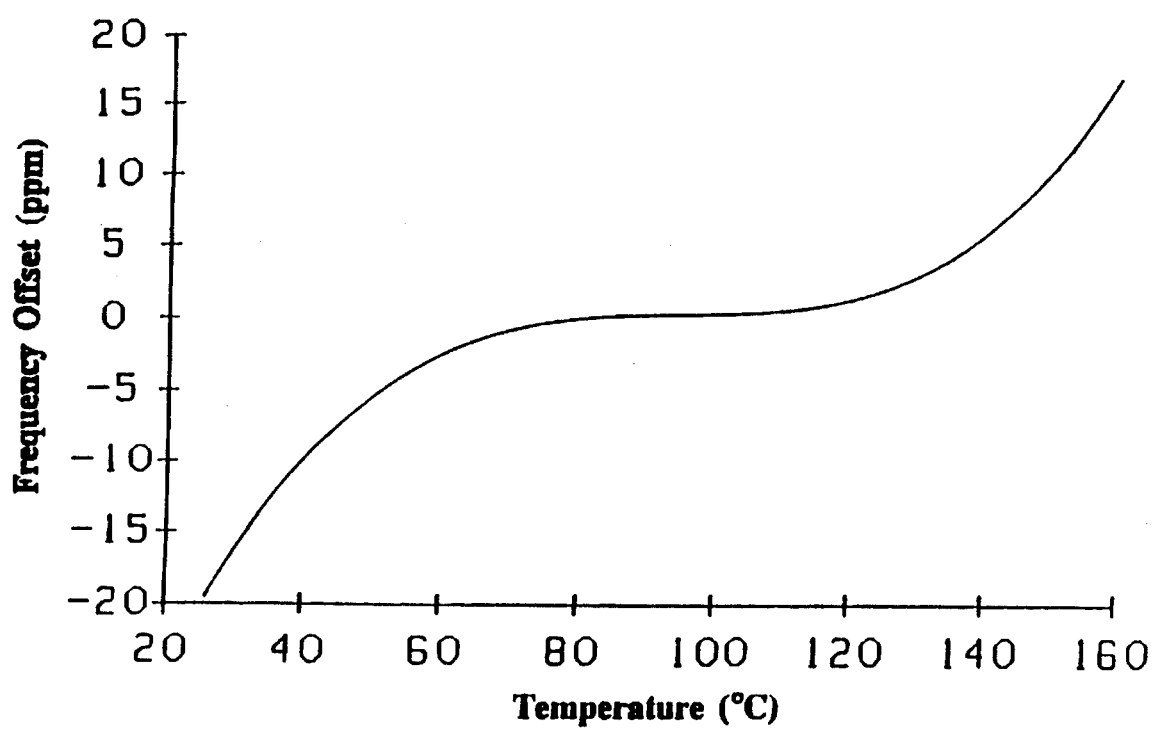
FIG. 1 is a chart depicting the f vs. T characteristic of an SC-cut resonator. The f vs. T characteristic of a resonator is a graph showing how the resonator's frequency varies with the resonator's temperature.

Additionally, three tables are included within this disclosure.

DETAILED DESCRIPTION OF THE INVENTION

As described in the Background of the Invention, those concerned with the development of crystal oscillators, as well as atomic frequency standards, have long recognized the need for higher f vs. T stability. The present invention provides for a method of increasing the f vs. T stabilities of an OCXO which meets this long-felt need and suffers from none of the disadvantages of previously available crystal oscillators with a lesser f vs. T stability such as temperature-compensated crystal oscillators, prior art OCXO's and rubidium frequency standards.

The present invention addresses the long-felt need for greater f vs. T stability, without any of the disadvantages of prior devices such as cumbersome size, high power requirements, a limited temperature range and the limited life of beam type standards. The present invention provides a method of increasing the f vs. T stability of an OCXO comprising the steps of forming an SC-cut quartz resonator with an upper and a lower turnover temperature, each being at or near said resonator's inflection temperature, inserting said resonator into a high-stability oscillator circuit which is placed in a high-stability, high thermal gain oven and adjusting the oven temperature to a set-point at or near one of said turnover temperatures of the resonator.

The preferred embodiment of the method of the present invention comprises forming an SC-cut quartz resonator having an upper and a lower turnover temperature, each being within 10 Kelvins ("K") of the inflection temperature of said resonator, inserting said resonator into a dual-mode high-stability oscillator circuit which is placed in an oven having a thermal gain exceeding 5,000 and temperature fluctuations smaller than 50 millikelvins ("mK") and utilizing a thermometric beat frequency of said resonator to adjust the oven temperature to a set-point within 100 mK of said lower turnover temperature of the resonator.

The f vs. T stability of an OCXO depends upon four primary factors, specifically: (1) both the static and dynamic f vs. T characteristics of the resonator in the sustaining circuit; (2) the difference between the oven's set-point and the point where the static f vs. T characteristic has a zero slope, meaning the oven's offset from the turnover point; (3) the oven's temperature excursions from the set-point, also known as the oven "cycling" range, and (4) the rate of change of temperature during the oven's temperature excursions. The dynamic f vs. T stability can dominate the static f vs. T stability when the resonator is not of the type that is thermal transient compensated, that is when the resonator is not an SC-cut crystal.

In order to attain maximum f vs. T stability, forming or selecting a thermal transient compensated resonator is one of the steps of the method of the present invention. While many SC-cut resonators exhibit a finite thermal transient effect, when operating in the vicinity of a "true" thermal compensated cut, small changes in the angles of the cuts can produce either positive or negative thermal transient effects. A "true" thermal compensated cut is one where the thermal transient effect is exactly 0 at one set of angles of cut in the vicinity of $\theta=34°$ and $\theta=22°$. The exact values of the "true" SC-cut angles vary with resonator configuration. The OCXO's dynamic f vs. T performance can also be influenced by factors such as transient effects in oven control and sustaining circuit components, therefore these factors must also be minimized during oven design.

Research demonstrates that with proper care, extremely high f vs. T stabilities are achievable and results similar to those shown in TABLE I below illustrate significant possibilities in this area. TABLE I depicts frequency offsets due to thermal cycling as a function of the offset of the oven set-point from the resonator turnover point, which is:

$$T_i - T_{TP} = 10K$$

The static f vs. T characteristic assumed in TABLE I was based upon an SC-cut resonator having a turnover point 10K from the inflection point. It should be noted, that the assumed f vs. T characteristic in TABLE I is not the optimum f vs. T characteristic that can be achieved. The smaller the $T_i - T_{Tp}$ resonator turnover point, the higher is the OCXO's f vs. T stability capability.

TABLE I

| for $T_i -$ | Oven Cycling Range (mK) | | | |
|---|---|---|---|---|
| $T_{TP} = 10K$ | 100 | 10 | 1 | 0.1 |
| Oven | 1000 | $4 \times 10^{-10}$ | $4 \times 10^{-11}$ | $4 \times 10^{-12}$ | $4 \times 10^{-13}$ |
| Offset | 100 | $6 \times 10^{-11}$ | $4 \times 10^{-12}$ | $4 \times 10^{-13}$ | $4 \times 10^{-14}$ |
| (mK) | 10 | $2 \times 10^{-11}$ | $6 \times 10^{-13}$ | $4 \times 10^{-14}$ | $4 \times 10^{-15}$ |
| | 1 | $2 \times 10^{-11}$ | $2 \times 10^{-13}$ | $6 \times 10^{-15}$ | $4 \times 10^{-16}$ |

Referring now to FIG. 1, this chart depicts the f vs. T of an SC-cut resonator with a zero f vs. T slope at the inflection temperature. FIG. 1 depicts the f vs. T characteristic for the optimum resonator, which is a resonator where the turnover temperatures coincide with the inflection temperature. While FIG. 1 depicts f vs. T characteristics of the optimum resonator, such a resonator is difficult to fabricate. A cubic f vs. T characteristic was assumed in curve-fitting the FIG. 1 data and calculating the TABLE I figures. For small temperature excursions near a turnover temperature, the cubic approximation provides adequate accuracy. With careful X-ray orientation, angle correction, recontouring, design and fabrication, achieving such an f vs. T characteristic is possible. It is noted that the f vs. T characteristic depicted in FIG. 1 is from a resonator produced by recontouring, as described more fully in the above-cited J. R. Vig, W. Washington & R. L. Filler reference, and the above-cited patent reference of J. R. Vig, one of the co-inventors herein.

If a recontoured resonator is utilized, the figures shown in TABLE I become much smaller, as is demonstrated in TABLE II below.

TABLE II below depicts frequency offsets due to thermal cycling, as a function of the offset of the oven set-point from the resonator turnover point, which is $T_i-T_{T_p}=0K$, and similar to both FIG. 1 and TABLE I, a cubic f vs. T was assumed for calculating the TABLE II figures.

TABLE II

| for $T_i -$ | Oven Cycling Range (mK) | | | |
|---|---|---|---|---|
| $T_{TP} = 0K$ | 100 | 10 | 1 | 0.1 |
| Oven 1000 | $2 \times 10^{-11}$ | $2 \times 10^{-12}$ | $2 \times 10^{-13}$ | $2 \times 10^{-14}$ |
| Offset 100 | $4 \times 10^{-13}$ | $2 \times 10^{-14}$ | $2 \times 10^{-15}$ | $2 \times 10^{-16}$ |
| (mK)    10 | $8 \times 10^{-14}$ | $4 \times 10^{-16}$ | $2 \times 10^{-17}$ | $2 \times 10^{-18}$ |
|            1 | $6 \times 10^{-14}$ | $8 \times 10^{-17}$ | $4 \times 10^{-19}$ | $2 \times 10^{-20}$ |

The degree of accuracy of oven temperature setting to the optimum set-point depends primarily on the hysteresis of the resonator and of the thermometer. Secondary factors are the noise of the resonator, thermometer and amplifier. If, for example, the normalized beat frequency of between three times the fundamental mode frequency minus the third overtone frequency is used as the thermometer, then the slope of the thermometric beat frequency is about $10^{-4}/K$, and the hysteresis of this type of SC-cut resonator, over a much wider temperature than is necessary for setting the oven to turnover, is about $10^{-8}$. Therefore based on TABLE II, in principle, the temperature can be set to within about $10^{-4}K$ of the optimum set-point.

Oven stability depends on both the temperature changes in the oven's environment as well as the thermal design of the oven. Excellent oven stability can be obtained, even with a single oven, if the oven is properly designed. A thermal gain of $10^5$ can be obtained with a single oven. This means that, for example, if the environment changes by 100K, the inside temperature of the oven changes by only 1 mK. According to TABLE II, if the oven is stable to 1 mK, then as long as the oven offset is approximately 0.5K, the OCXO's instability due to temperature fluctuations will be less than its short term instability, $\sigma_{65}(\tau)$ floor, i.e., less than $10^{-13}$. Therefore, the f vs. T stability can be superior to those of even the best atomic frequency standards.

Figure 2:
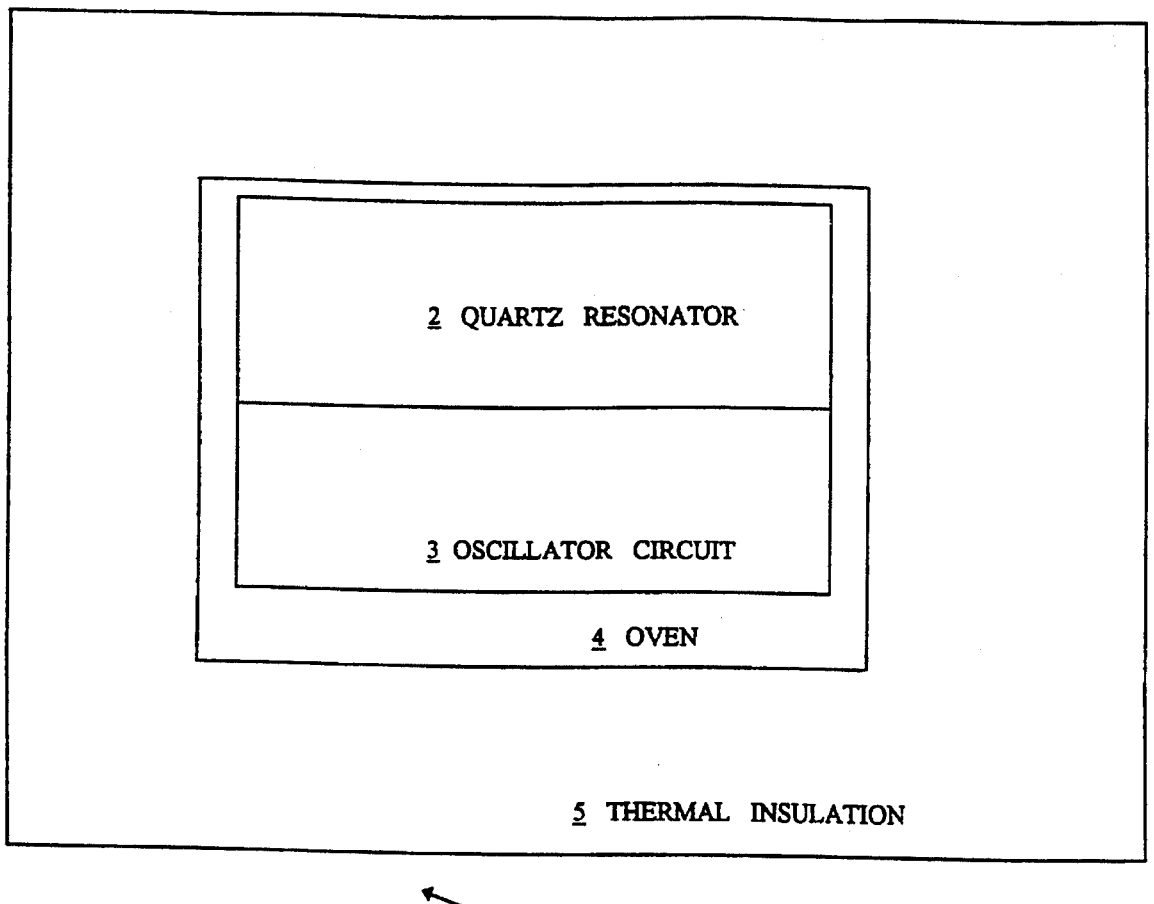
"FIG. 2 is a schematic drawing showing the oven controlled crystal oscillator, the quartz resonator, the oscillator circuit and oven utilized in the method of applicants' invention."

FIG. 2 illustrates the main features of subjects invention, in which 1 is the oven controlled crystal oscillator, 2 is the quartz resonator, 3 is the oscillator circuit, 4 is the oven, and 5 is thermal insulation which thermally isolates the oven from the outside world.

TABLE III below shows typical f vs. T stabilities of the major types of commercially available atomic frequency standards. It is clear from TABLES II and III that the f vs. T stabilities comparable to those of the atomic standards can be achieved with a suitably made OCXO.

TABLE III

| Atomic standard type | f vs. T stability | Temperature range (°C.) |
|---|---|---|
| Small rubidium | $3 \times 10^{-10}$ | −55 to +65 |
| Militarized cesium | $2 \times 10^{-11}$ | −28 to +65 |
| Commercial cesium | $1 \times 10^{-13}$ | 0 to +50 |

If such all OCXO also has an aging rate of, for example, $2 \times 10^{-11}$ per day, which the best available OCXO's can achieve after extended operations, then the OCXO can maintain a frequency accuracy equal or better than the accuracy of a miniature rubidium standard, for periods of up to about two weeks. There are tradeoffs such as retrace effects and longer stabilization time. Retrace effects, parts in $10^{10}$ even in the best OCXO, would require the OCXO to remain continuously powered or recalibrated after turn-on in order to maintain this state of high accuracy. Also, OCXO's do require a longer stabilization time in order to achieve parts in $10^{11}$ per day aging rates. On the other hand, OCXO's have the advantages of better reliability and short term stability, lower cost, longer life, smaller size and power requirements, as well as the ability to operate over a wider temperature range than atomic standards can.

The first embodiment of the method of the present invention comprises the steps of forming an SC-cut quartz resonator having an upper and a lower turnover temperature at or near an inflection temperature of said resonator, inserting said resonator into a high-stability oscillator circuit, heating said circuit in a high-stability., high thermal gain oven and adjusting the oven temperature to a set-point at or near one of the turnover temperatures to provide for higher f vs. T stability in an OCXO.

The preferred embodiment of the method of the present invention comprises the steps of forming an SC-cut quartz resonator having an upper and a lower turnover temperature within 10K of an inflection temperature of said resonator, inserting said resonator into a dual-mode high-stability oscillator circuit, heating said circuit in an oven having a thermal gain exceeding 5,000 and temperature fluctuations lesser than 50 mK, and utilizing a thermometric beat frequency of said resonator to adjust the temperature of said oven to a set-point within 100 mK of the lower turnover temperature of said resonator.

Variations of the first and preferred embodiments include the following additional steps of the method of the present invention. For example, forming said resonator to have a turnover temperature less than 1K of the inflection temperature, and selecting the set-point of the oven more than 100 mK from the lower turnover temperature. Moreover, the method of the present invention also encompasses advantageously selecting a set-point near an upper turnover temperature, rather than the lower temperature. Further, the method of the present invention also encompasses a step of selecting a resonator having the necessary attributes, rather than forming such a resonator.

Accordingly, having shown and described what are at present considered to be the preferred and several embodiments of this invention, it should be understood that the same have been shown by way of illustration and not limitation. It should be understood, of course, that the foregoing disclosure relates only to a small number of preferred embodiments and that numerous modifications and alterations may be made therein without departing from the spirit and the scope of the invention as set forth in this disclosure and the appended claims. All modifications, alterations and changes coming within the spirit and scope of the invention are hereby meant to be included.

What we claim is:

1. A method for increasing frequency vs. temperature stability of an Oven Controlled Crystal Oscillator, comprising the steps of:

forming a quartz resonator with an upper turnover temperature and a lower turnover temperature near an inflection temperature of said resonator, said resonator being nearly thermal transient compensated;

inserting said resonator into a high-stability oscillator circuit;

placing said circuit in a high-stability, high thermal gain oven; and adjusting said oven to a set-point near said upper turnover temperature.

2. The method for increasing frequency vs. temperature stability of an Oven Controlled Crystal Oscillator, as recited in claim 1, wherein said resonator is thermal transient compensated.

3. The method for increasing frequency vs. temperature stability of an Oven Controlled Crystal Oscillator, as recited in claim 2, wherein said resonator is SC-cut, having angles of cut in the vicinity of $\theta=34°$ and $\phi=22°$.

4. The method for increasing frequency vs. temperature stability of an Oven Controlled Crystal Oscillator, as recited in claim 1, wherein said resonator is formed having said upper turnover temperature and said lower turnover temperature at said inflection temperature of the resonator.

5. The method for increasing frequency vs. temperature stability of an Oven Controlled Crystal Oscillator, as recited in claim 4, wherein said set-point is adjusted to said upper turnover temperature.

6. The method for increasing the frequency vs. temperature stability of an Oven Controlled Crystal Oscillator, as recited in claim 1, wherein said set-point is adjusted near said lower turnover temperature.

7. The method for increasing the frequency vs. temperature stability of an Oven Controlled Crystal Oscillator, as recited in claim 6, wherein said set-point is adjusted to said lower turnover temperature.

8. The method for increasing the frequency vs. temperature stability of an Oven Controlled Crystal Oscillator, as recited in claim 3, further comprising the steps of:

forming said resonator with said upper turnover temperature and said lower turnover temperature being within 1K of said inflection temperature; and adjusting said set-point to be within 100 mK of said lower turnover temperature.

9. The method for increasing frequency vs. temperature stability of an Oven Controlled Crystal Oscillator, as recited in claim 1, wherein the high-stability, high thermal gain oven possesses a thermal gain exceeding 5,000.

10. A method for increasing frequency vs. temperature stability of an Oven Controlled Crystal Oscillator, comprising the steps of:

forming a quartz resonator with an upper turnover temperature and a lower turnover temperature within 10K of an inflection temperature of said resonator, said resonator being nearly thermal transient compensated;

inserting said resonator into a dual-mode, high-stability oscillator circuit;

placing said circuit in a high-stability, high thermal gain oven having a thermal gain above 5,000 and a plurality of temperature fluctuations lower than 50 mK; and adjusting said oven to a set-point within 100 mK of said lower turnover temperature.

11. The method for increasing frequency vs. temperature stability of an Oven Controlled Crystal Oscillator, as recited in claim 10, wherein said resonator is thermal transient compensated.

12. The method for increasing frequency vs. temperature stability of an Oven Controlled Crystal Oscillator, as recited in claim 11, wherein said resonator is SC-cut, having angles of cut in the vicinity of $\theta=34°$ and $\phi=22°$.

13. The method for increasing frequency vs. temperature stability of an Oven Controlled Crystal Oscillator, as recited in claim 12, further comprising the step of utilizing a thermometric beat frequency of said resonator when adjusting said oven.

14. The method for increasing frequency vs. temperature stability of an Oven Controlled Crystal Oscillator, as recited in claim 10, wherein said resonator is formed having said upper turnover temperature and said lower turnover temperature at said inflection temperature of the resonator.

15. The method for increasing the frequency vs. temperature stability of an Oven Controlled Crystal Oscillator, as recited in claim 14, wherein said set-point is adjusted to said lower turnover temperature.

16. The method for increasing the frequency vs. temperature stability of an Oven Controlled Crystal Oscillator, as recited in claim 13, further comprising the steps of:

forming said resonator with said upper turnover temperature and said lower turnover temperature being within 1K of said inflection temperature; and adjusting said set-point to be within 100 mK of said lower turnover temperature.

\* \* \* \* \*

UNITED STATES PATENT AND TRADEMARK OFFICE
CERTIFICATE OF CORRECTION

PATENT NO. : 5,530,408
DATED : June 25, 1996
INVENTOR(S) : John R. Vig, et al

It is certified that error appears in the above-identified patent and that said Letters Patent is hereby corrected as shown below:

Column 3, line 13, delete "figure" and insert --figures--;

column 3, line 18, delete quotation mark;

column 3, line 21, delete quotation mark;

column 4, line 18, delete "$\theta = 22°$" and insert --$\phi = 22°$--;

column 5, line 42, delete "$\sigma_{65}(\tau)$" and insert --$\sigma_y(\tau)$--;

column 5, line 45, delete "subjects" and insert --subject--;

column 6, line 17, delete "." after stability.

Signed and Sealed this

Twenty-fourth Day of December, 1996

Attest:

BRUCE LEHMAN

*Attesting Officer*   *Commissioner of Patents and Trademarks*